United States Patent
Klein et al.

(10) Patent No.: US 8,159,129 B2
(45) Date of Patent: Apr. 17, 2012

(54) RADIATION EMITTING DEVICE

(75) Inventors: Markus Klein, Tegernheim (DE); Florian Schindler, Traunstein (DE); Ian Stephen Millard, Penang (MY); Sok Gek Beh, Penang (MY)

(73) Assignee: OSRAM Opto Semiconductor GmbH, Regensburg (DE)

( * ) Notice: Subject to any disclaimer, the term of this patent is extended or adjusted under 35 U.S.C. 154(b) by 210 days.

(21) Appl. No.: 12/443,324

(22) PCT Filed: Sep. 11, 2007

(86) PCT No.: PCT/DE2007/001637
§ 371 (c)(1),
(2), (4) Date: May 13, 2009

(87) PCT Pub. No.: WO2008/040288
PCT Pub. Date: Apr. 10, 2008

(65) Prior Publication Data
US 2010/0007269 A1      Jan. 14, 2010

(30) Foreign Application Priority Data

Sep. 29, 2006   (DE) .................. 10 2006 046 234
Nov. 27, 2006   (DE) .................. 10 2006 055 884

(51) Int. Cl.
*H01J 1/62* (2006.01)
*H01J 63/04* (2006.01)

(52) U.S. Cl. ........ 313/509; 313/503; 313/504; 313/506; 313/512

(58) Field of Classification Search .................. 313/503, 313/504, 505, 506, 512, 509
See application file for complete search history.

(56) References Cited

U.S. PATENT DOCUMENTS

| | | | |
|---|---|---|---|
| 6,552,367 B1 | 4/2003 | Hsieh et al. | |
| 6,828,597 B2 | 12/2004 | Wegleiter et al. | |
| 7,786,670 B2 * | 8/2010 | Veres et al. | 313/509 |
| 7,855,506 B2 * | 12/2010 | Kato et al. | 313/506 |
| 2003/0052323 A1 | 3/2003 | Takeuchi et al. | |
| 2006/0214157 A1 * | 9/2006 | Kawauchi et al. | 257/40 |

(Continued)

FOREIGN PATENT DOCUMENTS

DE          100 49 573 A1        5/2001

(Continued)

OTHER PUBLICATIONS

Gaerditz, C., et al., "Polymer light-emitting devices for large area lighting," Proceedings of SPIE, the International Society for Optical Engineering, May 2006, pp. 61920W-1-61920W-9, vol. 6192.

*Primary Examiner* — Nimeshkumar Patel
*Assistant Examiner* — Thomas A Hollweg
(74) *Attorney, Agent, or Firm* — Slater & Matsil, L.L.P.

(57) ABSTRACT

The invention relates to a radiation emitting device, with a substrate (100) and a layer sequence disposed on top of it. Said layer sequence comprises a first electrode surface (200) with a first contact (210) for applying a voltage, at least one functional layer (300), which emits radiation during operation, and a second electrode surface (400). In the layer sequence, a plurality of partial regions is present that is modified in such a way that the emission of radiation visible to an external observer therefrom is interrupted. The distribution density of these partial regions varies depending on their distance from the contact.

36 Claims, 9 Drawing Sheets

U.S. PATENT DOCUMENTS

| | | | |
|---|---|---|---|
| 2006/0238117 A1* | 10/2006 | Veres et al. ................ 313/506 |
| 2007/0210700 A1* | 9/2007 | Kato et al. ................ 313/504 |
| 2007/0228368 A1 | 10/2007 | Takahashi et al. |

FOREIGN PATENT DOCUMENTS

| | | |
|---|---|---|
| DE | 101 47 887 A1 | 4/2003 |
| DE | 10 2006 013 408 A1 | 9/2007 |
| EP | 0 778 625 A2 | 6/1997 |
| EP | 1 484 632 A1 | 12/2004 |
| EP | 1 679 939 A2 | 7/2006 |
| EP | 1684550 * | 7/2006 |
| JP | 06-296041 A | 10/1994 |
| JP | 11-040362 A | 2/1999 |
| JP | 2000-231985 A | 8/2000 |
| WO | WO 2004/013920 A2 | 2/2004 |

* cited by examiner

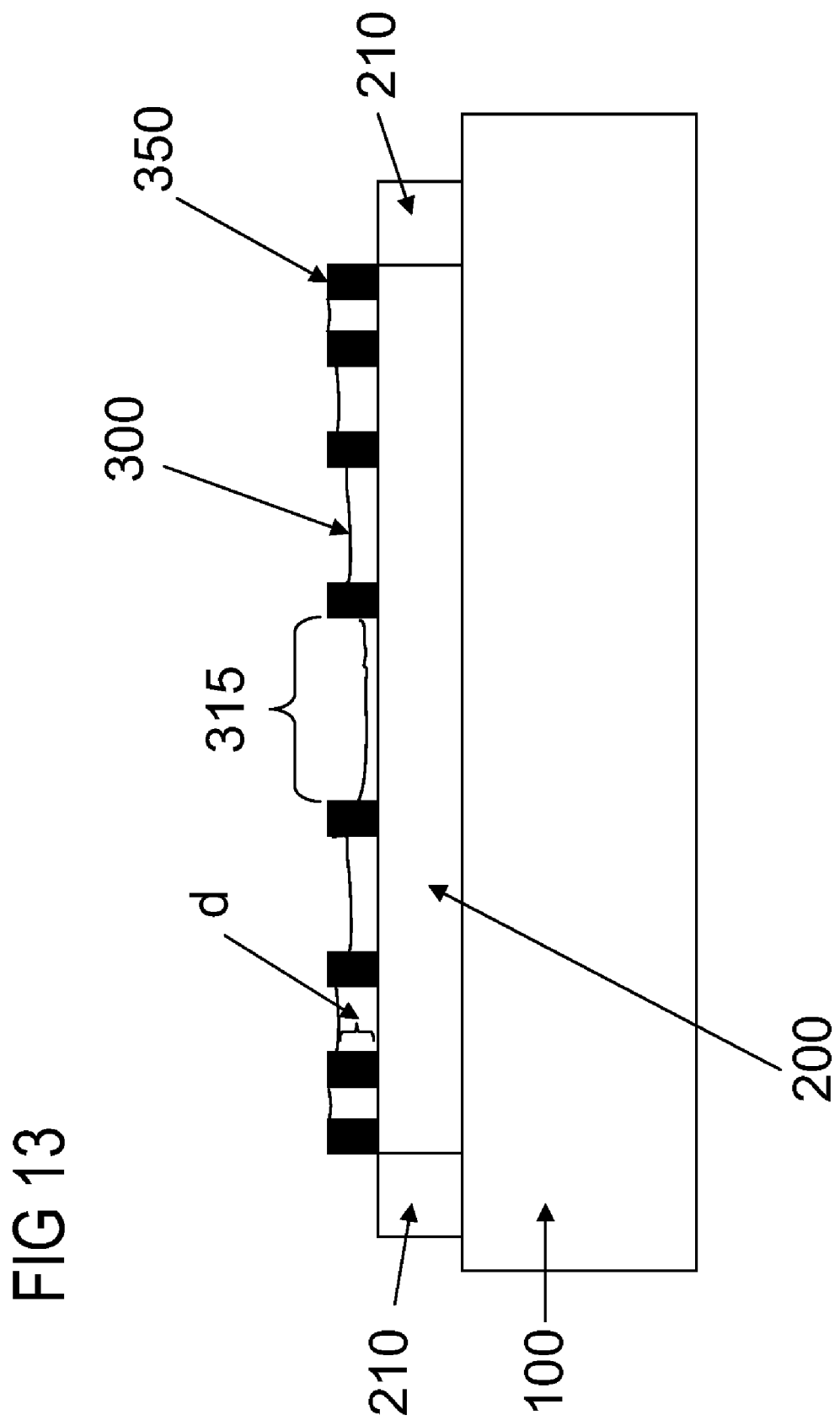

RADIATION EMITTING DEVICE

This patent application claims the priority of the German patent applications 10 2006 046 234.3 filed Sep. 29, 2006 and 10 2006 055 884.7 filed Nov. 27, 2006, whose disclosed content is hereby incorporated by reference.

TECHNICAL FIELD

The invention relates to a radiation emitting device with at least one functional layer that emits radiation during operation.

BACKGROUND

Radiation emitting devices are suitable as large surface, thin lighting elements. However, due to their construction, they have a voltage drop along the lateral direction that affects the light density, and therefore, the brightness. Therefore, the radiated light is not homogenous, but rather shows differences in the local light density.

SUMMARY

In one aspect, the invention provides a radiation emitting device that is characterized by an improved, homogenized light density, and that therefore reduces the above named disadvantages.

In radiation emitting devices according to an embodiment of the invention, a plurality of partial regions are introduced into the layer sequence, in which the light density of the radiation is reduced.

Such a radiation emitting device preferably comprises a substrate and a layer sequence disposed on the substrate. There, the layer sequence comprises a first electrode surface on the substrate with a first contact for applying a voltage, at least one functional layer that emits radiation during operation, and a second electrode surface on the at least one functional layer. In this layer sequence, a plurality of partial regions is present that is modified in such a way that from the partial regions, the emission of radiation visible to an external observer is interrupted. The distribution density of these partial regions varies depending on their distance from the contact. The advantage of this arrangement is that the light density of the radiation emitting device varies depending on the distance from the contact. Through the plurality of partial regions, whose distribution density depends on the distance to the contact, the changed light density can be counteracted. It is particularly advantageous in this arrangement if the modified partial regions are preferably disposed in the regions of the radiation emitting device, in which without these partial regions, a higher light density would normally be present. In this way, the light density can be reduced in these regions, and thus, a more uniform distribution of the light density can be achieved over the entire luminescent surface (radiation output surface) of the radiation emitting device. This leads to a homogenization of the light density of the luminescent partial regions.

A further advantageous feature in a further embodiment of the invention is a radiation emitting device with partial regions that are not detectable by an outside observer with the naked eye. Furthermore, the radiation emitting device can also have partial regions that have microscopic extents. Thereby, the light impression is not disrupted for an outside observer, rather, he perceives only the light density modified, or homogenized by the introduced partial regions.

Furthermore, the invention can have the advantageous feature that the radiation emitting device has partial regions that reduce the light density of the emitted radiation. This has the advantage that regions of the functional layer, which would have a higher light density without the partial regions, can be regulated in their average brightness through the introduction of the partial regions.

Advantageously, the first contact is present on the side of the first electrode surface. With that, the first electrode surface can be supplied with voltage.

Advantageously, a third contact is present on the side of the second electrode surface, whereby, the second electrode surface can be supplied with voltage.

The at least one functional layer can advantageously comprise one organic functional layer, and can preferably comprise also a charge transfer layer. The material of the functional layer can comprise polymers and/or small molecules. With this, the radiation emitting device is an organic, light emitting diode (OLED) that is particularly well suited as a large surface lighting element.

The at least one functional layer can also be an inorganic functional layer, for example, based on phosphide or nitride compound semiconductors. Preferably, the materials are those that comprise the general formula $Al_nGa_mIn_{1-n-m}P$, where $0 \leq n \leq 1$, $0 \leq m \leq 1$ and $n+m \leq 1$ or nitride-III/V compound semiconductors, preferably comprising the general formula $Al_nGa_mIn_{1-n-m}N$, where $0 \leq n \leq 1$, $0 \leq m \leq 1$ and $n+m \leq 1$.

The voltage drop of the radiation emitting device can be due to, among other things, the conductivity of one or both, thus the first and second, electrode surfaces. This first and/or second electrode surface can be a semitransparent or a transparent electrode surface that enclose radiation emitting functional layers. Here, one of the two electrode surfaces can also be a reflecting electrode surface. The conductivity of the transparent electrode surfaces can be reduced by two to three or more orders of magnitude relative to the conductivity of a reflecting electrode surface. With such electrode surfaces, a voltage drop can occur that increases with increasing distance to the contacts of the first and/or second transparent electrode surface, and thus, can lead to a diminishing light density. Therefore, the radiated light is not homogenous, but rather has differences in light density.

Furthermore, the radiation emitting device can comprise preferably a first and/or second electrode surface that is semitransparent or transparent for the radiation emitted from the functional layer. The advantage in this is that the generated radiation can be emitted through the first and/or second electrode surface. Compared to electrode surfaces that are composed of pure, thick metal layers and are not transparent, electrode surfaces that comprise metals and/or other components and are transparent have a lower conductivity. The voltage applied to the contacts decreases with increasing distance from the contact, and thus, leads to a decreasing light density from the radiation emitting device.

In an advantageous embodiment, the material of the first and/or second electrode surface comprises metal oxides. Transparent conductive oxides (TCO) are transparent, conductive materials, in general, metal oxides, for example zinc oxide, tin oxide, cadmium oxide, titanium oxide, indium oxide or indium tin oxide (ITO). Along with binary metal oxide compounds, such as $ZnO$, $SnO_2$ or $In_2O_3$, the ternary metal oxide compounds, such as $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of various transparent conducting oxides, belong to the group of TCOs. Furthermore, the TCOs do not necessarily correspond to a stoichiometric composition, and can also be p-doped or n-doped.

Likewise, transparent electrodes can comprise highly conductive organic materials, such as PEDOT, or doped organic layers, as well as, metals, for example Ag, or combinations of the named possibilities.

A further advantageous feature of a further exemplary embodiment of the invention is a radiation emitting device that has between the first and the second electrode surfaces a plurality of elements, which are insulating and/or nontransparent for the radiation, in the partial regions. Their distribution density and/or geometric shape vary, once again, depending on the distance of the element from the first and/or third contact. These elements have the advantage that they can modify the brightness of the radiation emitting device that depends on the distance from the contact. Thus in this embodiment, the above mentioned partial regions are modified by the elements that are insulating and/or nontransparent for the radiation, such that from them the output of the radiation from the device is blocked.

Advantageously, the distribution density of the insulating and/or nontransparent elements decreases with increasing distance from the first and/or third contact. Furthermore, the insulating and/or nontransparent elements that are present between the first and second electrode surface can prevent an emission of radiation from the device in these partial regions. This has the advantage that the regions of the layer sequence that without the elements would have a higher light density, and are located near the first and/or third contact, have a high distribution density of insulating and/or nontransparent elements; and that the regions which without the elements would have a lower light density in comparison to the regions located closer to the contact, and which are located at a greater distance from the contact, have a lower distribution density of insulating and/or nontransparent elements. Thus, the radiation emission is reduced to a greater degree by the elements in the regions with normally higher light density than in the regions with normally lower light density. Therefore, the light density difference across the surface can be reduced or equalized given a suitable variation of the distribution density.

Here, it is particularly advantageous if the distribution density of the insulating and/or nontransparent elements is selected such that the difference of the light density of the radiation emitted from the device between the different regions of the device with different distribution densities of the elements amounts to a maximum of 20%. This has the advantage that such a brightness difference is barely perceptible to the outside observer, and an improved, more homogenous light density is provided.

Furthermore, the insulating and/or nontransparent elements can be formed linearly and arranged in a periodic structure in the functional layer. Such a periodic structure can comprise, for example a lattice. The lattice can have a lattice distance between adjacent linear elements that increases with increasing distance from the first and/or third contact. Such a lattice with varying periodicity can be incorporated simply and cost-effectively into the radiation emitting device, without essential changes to the layer sequence of the device. Also, the production process does not need to be modified in order to incorporate such a lattice into the device.

The functional layer can be disposed at least between the linear elements. Furthermore, the layer thickness of the functional layer between adjacent linear elements can decrease with increasing lattice spacing of the elements. Additionally, the functional layer can also be disposed above the linear elements. Thus, the layer thickness of the functional layer between adjacent linear elements can be controlled with the lattice distance because during application of the at least one organic functional layer, an uncontrolled transport of material beyond the electrode surface across the linear, insulating and/or nontransparent elements, disposed in a lattice, can be prevented or diminished. This can depend upon the surface tension of the material of the functional layer between adjacent linear elements. The transport of material can furthermore be prevented by the fact that the insulating and/or nontransparent elements are not, or only weakly, wetting for the material of the organic functional layer. In the regions that are bounded by the linear insulating and/or nontransparent elements, the material of the functional layer accumulates independently of each other during application of the material for the functional layer by means of a wet chemical process, such as spin coating or blade coating, and dries to a specific layer thickness depending on the lattice distance. The layer thickness of the functional layer can decrease with increasing lattice spacing of the insulating and/or nontransparent elements, which is caused by the surface tension of the solution of the material for the functional layer. Therefore, in the regions, which are bounded by adjacent insulating and/or nontransparent elements, the functional layer can form in a uniform layer thickness. Here, the layer thickness of the organic functional layer between adjacent linear elements decreases with the increasing distance of the linear elements from the first and/or third contact, because the distance of the adjacent linear elements increases with greater distance from the first and/or third contact.

Furthermore, the intensity of the emitted radiation can decrease with increasing layer thickness. This means that with increasing distance from the contact, the lattice spacing between adjacent linear elements becomes greater, and therefore the layer thickness of the functional layer present between the linear elements becomes smaller. Therefore, in the regions near the contact, in which a stronger intensity of the radiation would be present without the linear elements, the intensity is decreased both due to the greater thickness of the functional layer, and to the larger number of linear insulating and/or nontransparent elements, and to an observer, is more uniform over the entire electrode surface. Due to this homogenization of the emitted radiation, an observer is less sensitive to other possible variations of the emitted radiation or defects, and therefore, has an improved, more uniform overall impression.

Furthermore, the intensity of the emitted radiation can increase with increasing layer thickness. In this case, the lattice spacing can continue to decrease with increasing distance from the first and/or third contact, in order to obtain the homogenized emitted radiation throughout the surface.

In an advantageous embodiment, the insulating elements comprise electrically insulating elements and due to their electrically non-conducting properties, disrupt the emission of radiation in the partial regions of the layer sequence, in which they are present. Thus, the radiation in the partial regions is disrupted, and the radiation loses brightness across the surface.

Furthermore, the material of the electrically insulating elements can be transparent for the emitted radiation, and the size of the insulating elements can advantageously amount to a few micrometers, preferably less than 200 µm, more preferably less than 100 µm, particularly preferably less than 20 µm. This has the advantage that the insulating elements, and therefore the non-luminescent regions of the radiation emitting device, as a rule cannot be resolved by the naked eye, and thus do not disrupt the overall image of the lighting surface. Also, due to the varying distribution density, only as many insulating elements are present as are necessary, so that only a low surface covering of the first and/or second electrode surface by the electrical insulating elements is present.

For this, the material of the electrically insulating elements can be advantageously selected from a group that comprises photoresists, nitrides, ceramics, oxides and organic insulating compounds.

In a further advantageous embodiment, the elements in the partial regions in the layer sequence are nontransparent for the emitted radiation, or reflect and/or absorb the radiation. This means that the emission or generation of the radiation in the layer sequence is not disrupted, but rather, only its output from the radiation emitting device is blocked. This way, the brightness differences in the device are modified. Advantageously, the material of the nontransparent elements comprises metals.

In a further embodiment, the metals of the nontransparent elements are surrounded by an insulating casing, which can be, for example, a polymer casing.

In a further embodiment, the nontransparent elements for the radiation can be electrically conducting conductive paths. Advantageously, these conductive paths extend from the first and/or third contact across the first and/or second electrode surface. Their distribution density advantageously decreases with increasing distance from the first and/or third contact. For this purpose, it is advantageous if adjacent conductive paths have different lengths and the length distribution of the conductive paths, emanating from the first and/or third contact, has at least a maximum and a minimum. This embodiment has the advantage that due to the varying distribution density depending on the distance from the first and/or third contact, the emitted radiation is modified such that the light density differences, that are present without the introduced conductive paths, can be compensated or reduced. Due to the distribution density of the conductive paths that decrease with increasing distance from the first and/or third contact, the surface covering of the first and/or second electrode surface is kept as low as possible.

Furthermore, the first and/or third contact can be present on all sides of the first and/or second electrode surfaces. The first and/or third electrode surface is thus enclosed on all sides by the contact. If the conductive paths are disposed in a periodic structure, for example, a lattice with a lattice spacing between adjacent linear elements, then the lattice spacing increases with increasing distance from the first and/or third contact, and can be greatest, for example, in the center between opposite first and/or second contacts.

Furthermore, it is advantageous if the width of the conductive paths amounts to a few millimeters, preferably less than 200 μm, more preferably less than 100 μm, and particularly preferably less than 20 μm. This has the advantage that the conductive paths cannot be perceived by an outside observer with the naked eye.

Furthermore, the thickness of the conductive paths can advantageously have a range of less than 200 μm, preferably a range of 100 nm to 10 μm. Thus, they have the advantage that they can be present on the surface of the first and/or second electrode, and also, can extend through the entire functional layer and pierce it. In this case, an insulating layer, for example, an insulating polymer layer, surrounds the conductive paths. Thereby, short circuits to the (second) corresponding other electrode layer are avoided.

In a further advantageous embodiment, the first electrode surface can comprise a second contact for applying a voltage. Advantageously the second electrode surface can comprise a fourth contact. Furthermore, additional electrically conducting conductive paths can be present that extend, emanating from the second and/or fourth contact, across the first and/or second electrode surface. This embodiment has the advantage that the radiation emitted by the radiation output surface has a light density that in the area(s) between the first and second and/or the third and fourth contact, has a brightness minimum which can be compensated by the disposition of the conductive paths according to the invention. Here, it is particularly advantageous if the distribution density of the conductive paths that extend from the second and/or fourth contact across the electrode surface decreases with increasing spacing, and if the conductive paths emanating from the first and second and/or third and fourth contact do not intersect, and thus the brightness minimum is not exceeded. Furthermore, it is advantageous if adjacent conductive paths have different lengths and the length distribution of the conductive paths, emanating from the first and second and/or third and fourth contact respectively, has at least a maximum and a minimum. This has the advantage that the conductive paths again have a varying, decreasing distribution density depending on the distance from the first and second and/or third and fourth contact.

In a further embodiment, the maxima and minima of the length distribution of the conductive paths emanating from the first and second and/or third and fourth contact can be located opposite each other. Preferably, the maxima and minima of the length distribution of the conductive paths emanating from the first and second and/or third and fourth contact are disposed shifted relative to each other. The advantage of having maxima and minima shifted relative to each other is that the brightness modification is made symmetrical.

A further advantageous feature of a further embodiment of the invention is conductive paths that comprise branching structures. There, it is advantageous if increasing numbers of branching structures are disposed with increasing distance from the contact. The conductive paths can extend, for example, parallel to the lateral current density. Preferably, the thickness and/or width of the conductive paths decrease with increasing distance from the contact. This embodiment represents a quasi fractal distribution of the conductive paths. The advantage of this embodiment is not so much that the brightness is blocked, but rather, that the conductivity of the first and/or second electrode surface is increased by placing the conductive paths according to the invention. The brightness in regions with low light density is therefore increased due to the increased conductivity, achieved by means of the conductive paths, of the first and/or second electrode surfaces. At the same time, the covering of the lighting surface by the conductive paths is kept as low as possible, because their width decreases with increasing degree of branching, and thus, the conductive paths that are nontransparent for the radiation, cover increasingly less of the radiation surface.

A further advantageous feature of a further embodiment is a radiation emitting device in which the first and/or second electrode surface in the partial regions of the layer sequence comprises structured regions of the electrode material. Advantageously, the distribution density of these structured regions decreases with increasing distance from the first contact. These modifications can also include regions of the electrode, which are free of electrode material, that is, holes in the electrode. The advantage of this embodiment is that the light density is modified, by the conductivity of the electrode being modified.

A further advantageous feature of a further embodiment is a radiation emitting device, in which in the partial regions, the at least one functional layer has a reduced conductivity due to the absence of doping, or an increased injection barrier for charge carriers. Advantageously, the distribution density of the partial regions decreases with increasing distance from the first contact. The advantage of this embodiment is the modification of the light density by the absence of doping depending on the distance from the contact.

The invention relates further to a method for producing a radiation emitting device according to the exemplary embodiments listed above. The process steps comprise the disposition of a layer sequence on a substrate, wherein a plurality of partial regions in the layer sequence is introduced. This plurality of partial regions is modified in a way such that from them, the emission of radiation visible to an external observer is interrupted. These partial regions are created such that their distribution density varies depending on their distance from the contact.

Furthermore, in between the first and second electrode surface, a plurality of elements that are insulating and/or nontransparent for the radiation can be introduced into the partial regions using a vapor deposition mask. Here, the advantage is that the partial regions are introduced into the layer sequence in one processing step.

Furthermore, in the method, the first and/or second electrode surface can be structured in the partial regions, and/or the functional layer can be undoped in the partial regions.

BRIEF DESCRIPTION OF THE DRAWINGS

The invention will be explained in more detail based on the Figures and the exemplary embodiments:

FIG. 13 shows a schematic cross section of FIG. 12 with the layer thickness between the linearly formed elements.

DETAILED DESCRIPTION

Figure 1:
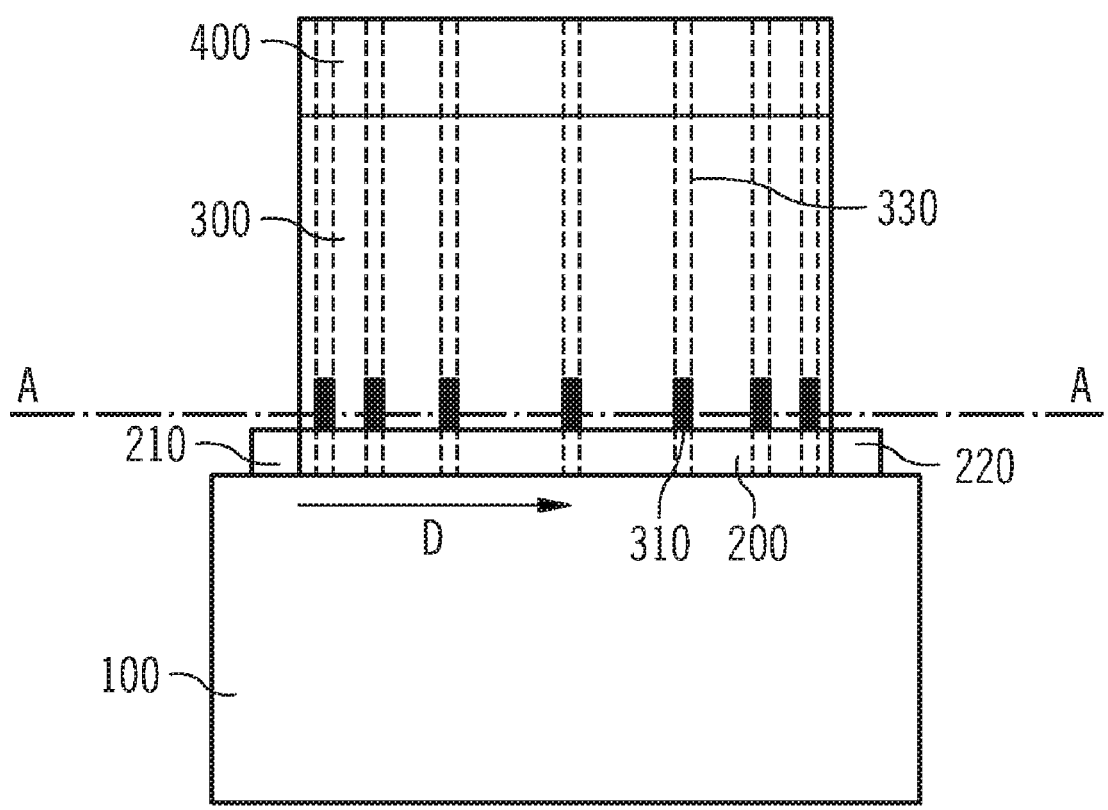
FIG. 1 shows the design of a radiation emitting device with a plurality of partial regions in cross section.
Figure 7:
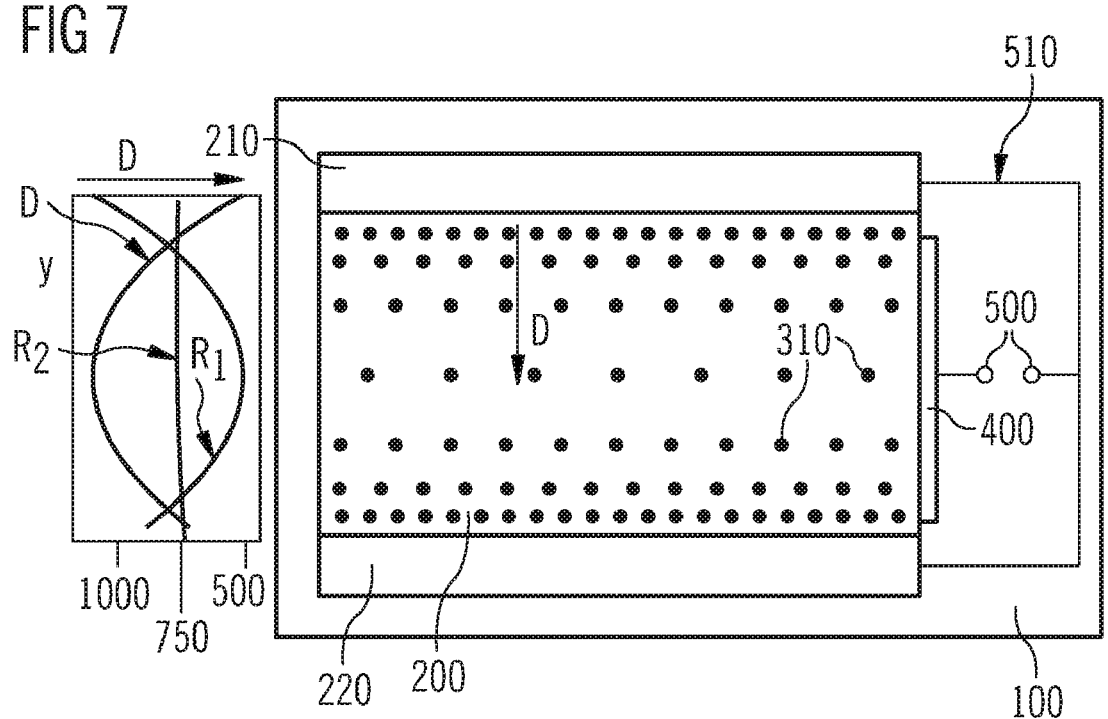
FIG. 7 shows in top view the first electrode surface with a first and a second contact, and with insulating elements, as well as, the light density distribution and element density.

FIG. 1 shows the general design of a radiation emitting device according to one embodiment of the invention. A first electrode surface 200 with a first contact 210 and second contact 220 is located on the substrate 100. On the substrate, a functional layer 300 is disposed that comprises insulating elements 310, which have a decreasing distribution density D with increasing distance from the contact. The direction in which the distribution density D decreases is indicated in FIG. 1 by an arrow. Finally, a second electrode surface 400 is disposed on the functional layer 300. Due to the introduced insulating elements 310, the layer sequence of the first electrode surface 200, functional layer 300 and second electrode surface 400 comprises a plurality of partial regions 330, which can extend through the entire layer sequence or can project through the second electrode surface 400, and which interrupt the emitted radiation. A indicates the cross-section at which the top view shown in FIG. 7 is taken.

Figure 2:
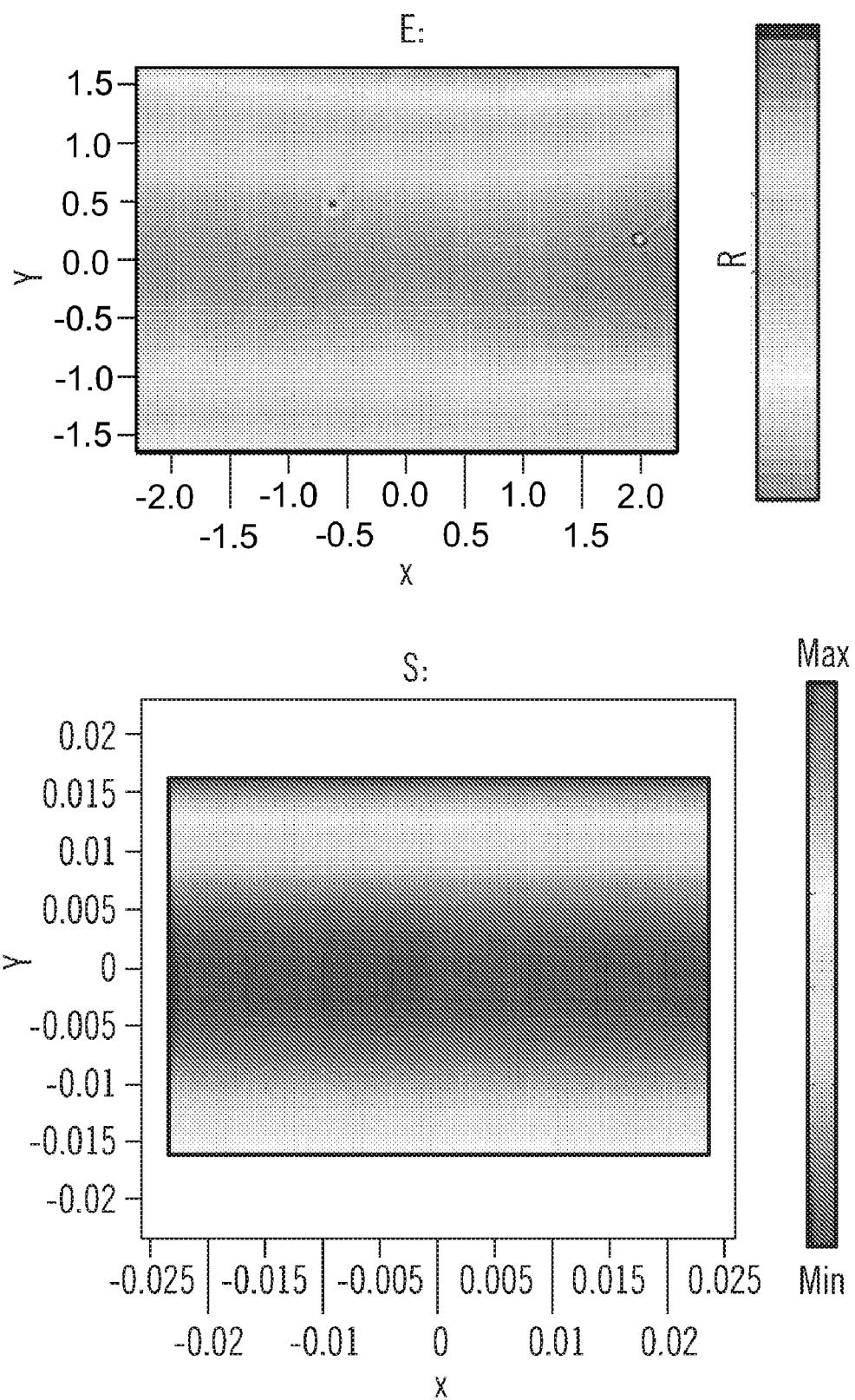
FIG. 2 shows an experimental and a simulated distribution of the light density distribution in conventional large surface OLEDs.

FIG. 2 shows an experimental and a simulated measurement of the light density of a conventional OLED. In Diagram E, the side of the electrode surface used for the contact is plotted on the x-axis against the free side on the y-axis. The light density R is high in the bright regions, and low in the dark regions. Because in the experiment, an OLED with two opposite located contacts was measured, there is a light density minimum exactly in the center region between the contacts. A very similar result is attained with a simulation that is shown in diagram S. Here too, the side of the electrode surface used for the contact is plotted on the x-axis against the free side on the y-axis, and the light density R over the entire surface is shown. Here too, the light density is the lowest in the region of the greatest distance from the two contacts (the upper and lower x axes). This is due to the fact that the conductivity of the electrode surface decreases with increasing distance from the contacts, and thus, also a lower light density results.

Figures 3, 4:
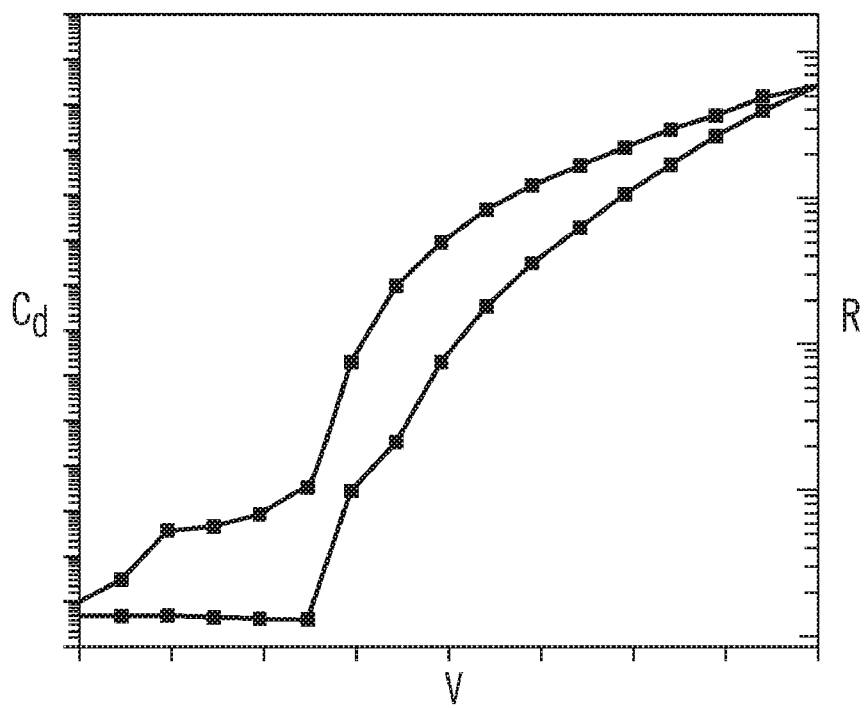
FIG. 3 shows a brightness-voltage characteristic curve together with a diode characteristic curve of a conventional light emitting diode.
FIG. 4 shows the current density of a conventional OLED surface.

FIG. 3 shows the light density differences in conventional diodes in the form of a brightness-voltage characteristic curve together with a diode characteristic curve. Here, the voltage V, on the x-axis is plotted against the current density $C_d$ on the left y-axis, and against the light density R on the right y-axis. At low voltages, both the current density and the light density are low. Both curves increase steeply with increasing voltage. This means that both the current density as well as the light density increase with increasing voltage, and decrease with decreasing voltage.

The consequence of this is shown in FIG. 4. Here, for a conventional OLED surface, the lateral current density $C_d$ in the electrode is shown over the area defined by the side surface towards the contact on the x-axis, and the free lying surface on the y-axis. On the contacts, thus, on the lower and upper x-axis, the voltage is high, and therefore the current density is high (long arrows). As the distance to the contacts decreases towards the center of the surface, the current density also decreases (short arrows). Thus, a non-homogeneous light density results over the entire OLED surface, with a light density minimum.

Figure 5:
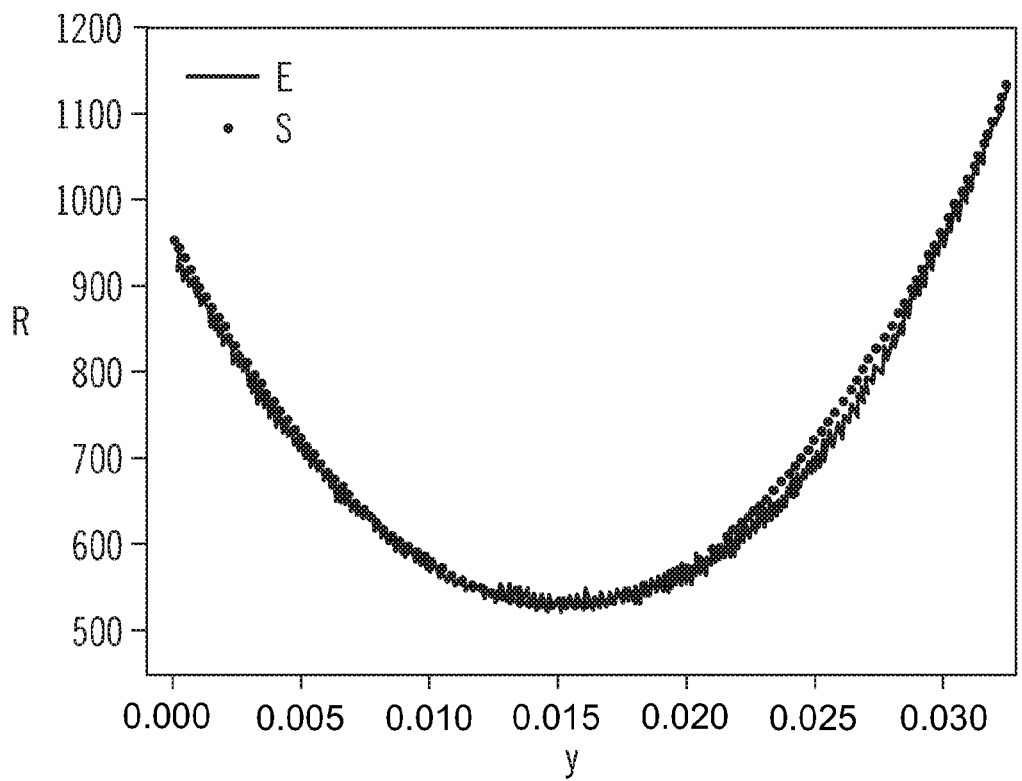
FIG. 5 shows the lighting density in cross section over a conventional OLED.

A further illustration of the non-homogeneity of the light density of a conventional OLED is shown in FIG. 5. The diagram illustrates the light density distribution along a cross section of an OLED along the open side surface, y, from the first to the second contact. The light density R is plotted on the left y-axis. This is high on the side edges, that is, close to the contacts, and decreases towards the center. This is substantiated by an experiment E (solid line) and a simulation S (dotted line), which both yield results in close agreement.

Figure 6:
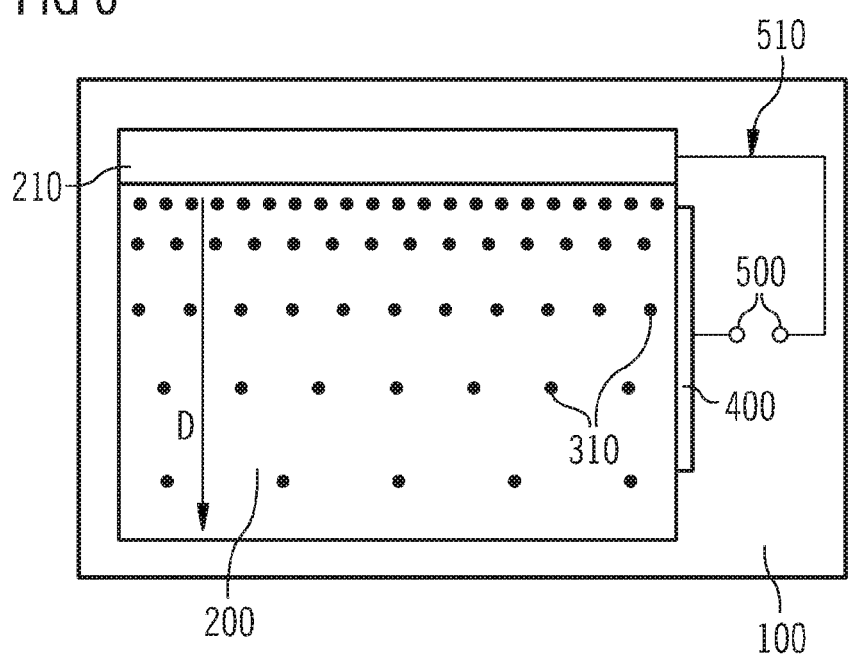
FIG. 6 shows in top view, an exemplary embodiment of a first electrode surface with a first contact and with insulating elements.

FIG. 6 shows an example of one embodiment according to the invention. It shows in a top view along the free lying surface, an electrode surface 200 with insulating elements 310 and a first side contact 210. A substrate 100 is located underneath it. The side contact is connected to the second electrode surface 400 via connections 500 and an electrical conductor 510. For clarity, the functional layer 300 is not drawn, the second electrode surface 400 is only suggested. The distribution density D of the insulating elements decreases with increasing distance from the contact. This direction in which the distribution density D decreases is represented by an arrow. Advantageously, these insulating elements are so small that they can no longer be resolved by an outside observer. For this reason, they are smaller than 200 µm, preferably smaller than 20 µm. They are electrically insulating elements, and in the partial regions 330 in which they are located, they decrease the light density R of the emitted radiation normally present in these regions without the elements; that is, the elements prevent the emission of radiation out of the radiation emitting device in the partial regions in which they are located. This occurs due to an interruption of the radiation by the insulating elements, which block the radiation due to their non-conducting properties. Advantageously, the variation of the distribution density of the insulating elements is selected such that the difference in the light density at the various distances from the contact on the surface of the functional layer amounts to less than 20%. The insulating elements are advantageously transparent for the emitted radiation and can be composed of photoresists, nitrides, ceramics, and oxides. Preferably, the insulating elements are electrically insulating elements. Electrically insulated, coated metals are also possible.

FIG. 7 shows a variation of the exemplary embodiment shown in FIG. 6. The top view is understood to be along the surface A from FIG. 1. Here, a second contact 220 is disposed opposite to the first contact 210, wherein both contacts are connected via electrical conductors 500 and electrical connections 510 to the second electrode 400. The substrate 100 is located underneath it. Electrically insulating elements 310 are again located on the electrode surface 200. For clarity, the functional layer 300 is not drawn; the second electrode surface is only suggested. Because their distribution density D, as illustrated with an arrow, decreases with increasing distance from the contacts, their concentration is lowest in the center of the surface. This means, in the regions close to the contacts, which without the electrically insulating elements would have a high light density R, the insulating elements in many partial regions 330 interrupt the emitted radiation; whereas, in regions at a greater distance from the contacts, which without the electrically insulating elements would have a lower light density, the insulating elements interrupt the emitted radiation only by a small amount, because their distribution density is lower. In this way, they compensate the light density differences which would be present in conventional light emitting devices, or reduce these differences that would be present without the insulating elements. At the same time, the decreasing distribution density can bring about a surface coverage of the radiation emitting device that is as low as possible. The relation between light density R and element density D in the cross section along the open side surface y is shown in the diagram next to the drawing. In the regions that without the insulating elements have a high light density $R_1$, the element density D is also high; in regions of lower light density, the element density is low. Thus, the resulting light density $R_2$ with the elements is nearly independent of the distance from the contacts (upper and lower axes).

Figure 8:
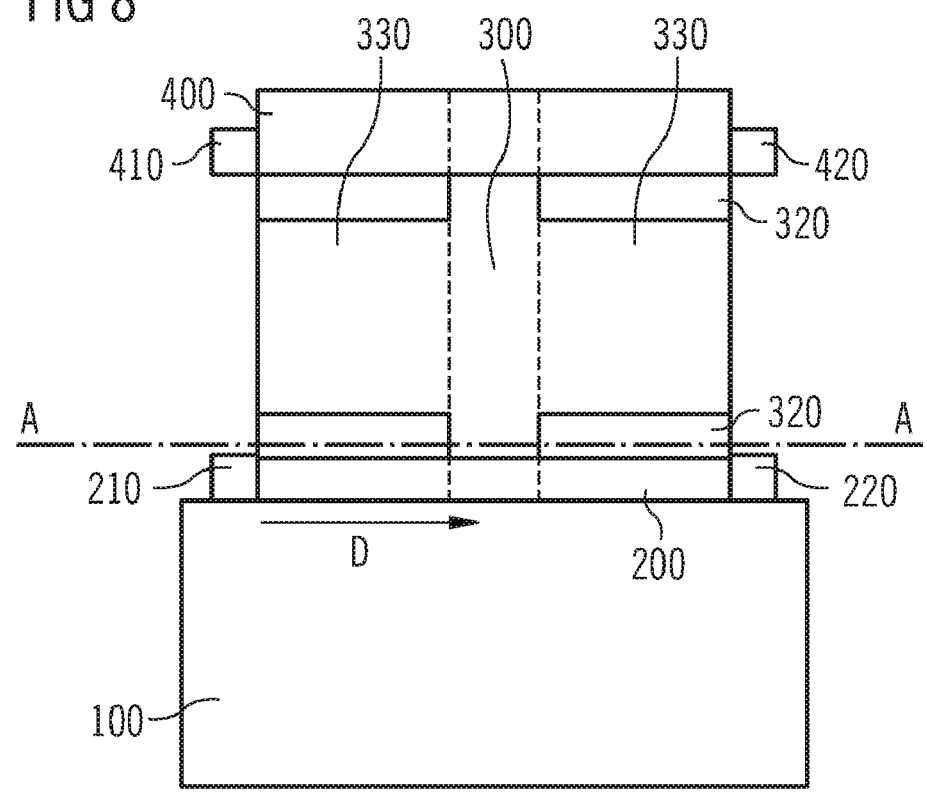
FIG. 8 shows in cross section the design of a further embodiment of a radiation emitting device according to the invention with a plurality of partial regions.

FIG. 8 shows the general design of a radiation emitting device according to one embodiment of the invention. A first electrode surface 200 with a first contact 210 and second contact 220 is located on the substrate 100. On the substrate, a functional layer 300 is disposed that comprises electrically conducting conductive paths 320, which have a decreasing distribution density D with increasing distance from the contact. The direction in which the distribution density decreases is illustrated with an arrow. Finally, a second electrode surface 400 with a third 410 and fourth contact 420 is disposed on the functional layer 300. Here too, conductive paths 320 are present whose distribution density D decreases with increasing distance from the contact. Due to the introduced conducting paths 320, the layer sequence of the first electrode surface 200, functional layer 300 and second electrode surface 400 comprises a plurality of partial regions 330, which extend through the entire layer sequence, and which interrupt the emitted radiation. The cross-section through A is shown in a top view in the following Figures. In the following Figures, only the first electrode surface 200 is discussed, however, the discussion applies equally to the second electrode surface 400, for the case that the second electrode surface 400 is also a semi-transparent or transparent electrode surface.

Figure 9:
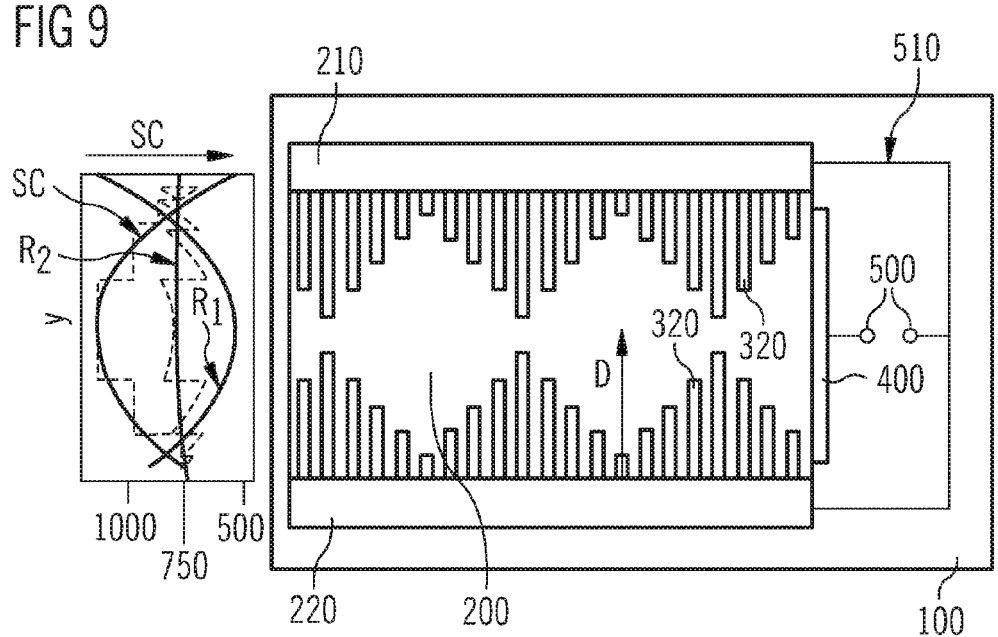
FIG. 9 shows in top view the first electrode surface with a first and a second contact, on which conductive paths are disposed together with the light density distribution and surface covering.

FIG. 9 shows a further embodiment of the device according to the invention. This figure illustrates the top view along the surface A from FIG. 8 onto the first electrode surface 200 disposed on the substrate 100, with a first contact 210 and a second contact 220, which is located opposite the first. The two contacts are connected to the second electrode surface 400 via electrical conductors 510 and electrical connections 500. Conductive paths 320 are disposed on the electrode surface. These can also be present on the second electrode surface 400, however, the following description relates only to the first electrode surface 200. The conductive paths 320 extend, in each case, away from the contact across the first electrode surface 200. Here, adjacent conductive paths have different lengths, and the length distribution of the conductive paths contains maxima and minima relative to the contacts. That leads to the fact that the conductive paths 320 have a distribution density D, which laterally decreases with increasing distance from the contacts, which is illustrated by the arrow. Here, the longest and shortest conductive paths are located exactly opposite each other, however, they are not in contact. This means that the region with the lowest light density is free of conductive paths. This leads to the fact that no surface covering is present there, whereas, in the region near the contact, where without the electrical conductive paths a high light density would prevail, a greater surface covering is present. Advantageously, the width of the conductive paths is less than 200 µm, preferably less than 20 µm, at which point the conductive paths can no longer be discerned by an outside observer. The thickness of the conductive paths can lie in the range of less than 200 µm, preferably in the range from 100 nm to 10 µm, which means that the conductive paths can be located only on the surface of the electrode surface, or extend into the functional layer 300 located on the electrode surface. In a further embodiment, these can also pierce the second electrode surface 400. In this case, the individual conductive paths are surrounded by an insulating layer. Next to the top view of the electrode surface, a diagram can again be seen which shows the relationship between light density R and surface covering SC in a cross section along the open side surface y. The solid lines represent the ideal curves, the dashed lines the actual curves. In regions, in which without the conductive paths a greater light density $R_1$ is present, the surface covering is high; in regions with lower light density $R_1$, the surface covering is low. With the arrangement of the conductive paths according to the invention, a light density $R_2$ results that is nearly independent of location, i.e. y.

Figure 10:
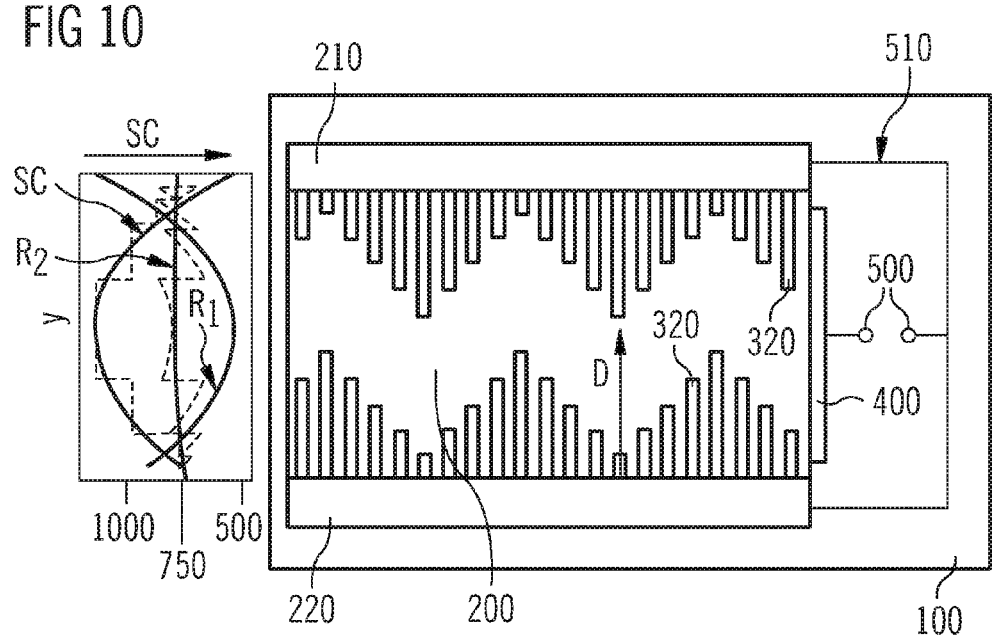
FIG. 10 shows in a top view a further exemplary embodiment of the first electrode surface with deposited conductive paths.

FIG. 10 illustrates an alternate embodiment to that of FIG. 9. In FIG. 10, the maxima and minima of the length distribution of the conductive paths 320 on the first electrode surface 200 are not located opposite to each other; rather they are shifted relative to each other. Therefore, the distribution density D, which decreases in the direction of the arrow, is higher in the regions farthest removed from the contacts 210 and 220 than in the example from FIG. 8, however, the symmetry of the light density distribution is improved. The relationship, illustrated in the diagram next to the top view of the electrode surface, between the light density $R_1$, which is present without the conductive paths 320, the surface covering SC, and the resulting light density $R_2$, is approximately equal to that illustrated in FIG. 6. This example of the arrangement of conductive paths 320 can also apply to the first and second electrode surfaces 200, 400.

Figure 11:
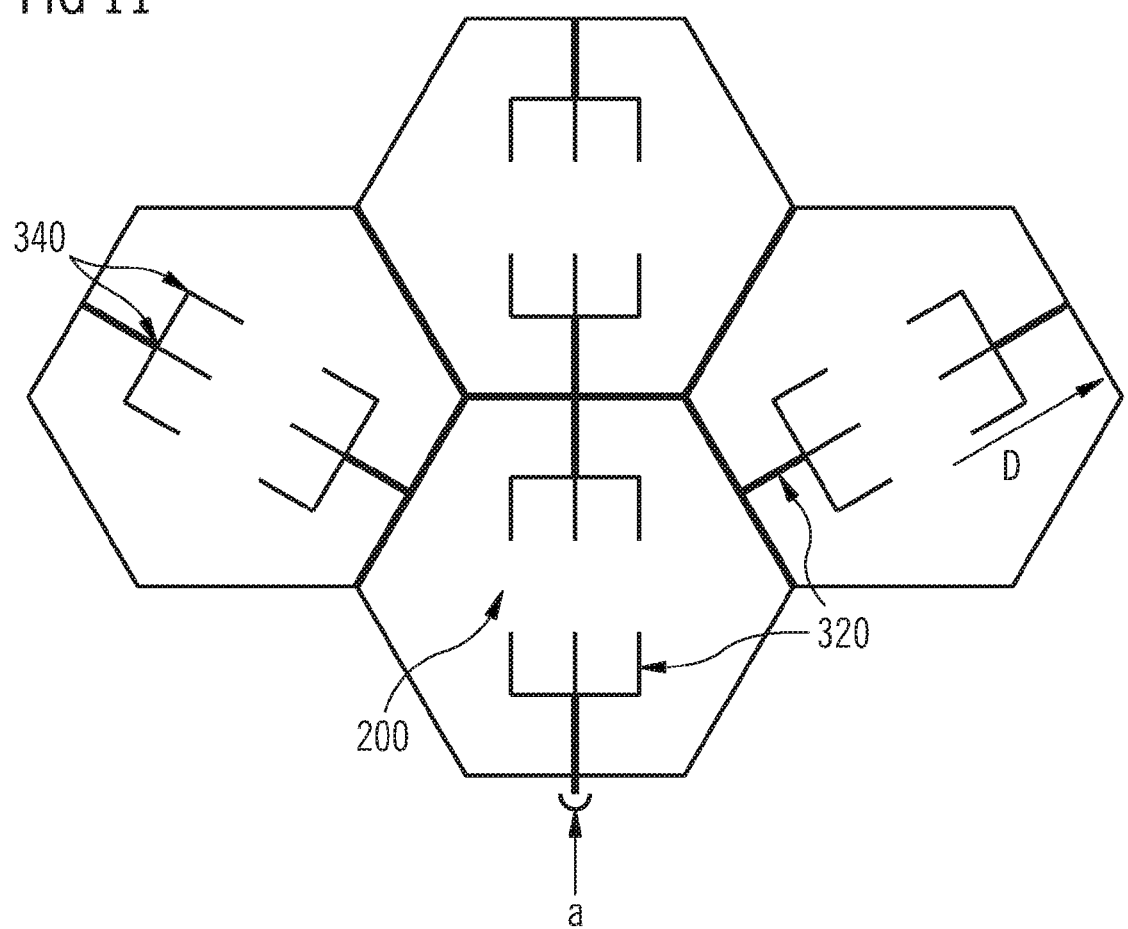
FIG. 11 shows in top view, a first electrode surface with branched conductive paths.

A further exemplary embodiment of the invention is illustrated in FIG. 11. Here, the light density differences on the honeycomb shaped electrode surface segments are eliminated, by introducing branched conductive paths 320. Their degree of branching increases with increasing distance from the contacts, whereas their thickness and/or width a decreases. Thus, even with many branchings 340, the surface covering is kept as low as possible, while the conductivity is increased by the conductive paths 320 in the regions further removed from the contacts. The direction of the decreasing distribution density D is illustrated with an arrow. This example for the arrangement of conductive paths 320 can also apply to the first and second electrode surfaces 200, 400.

Figure 12:
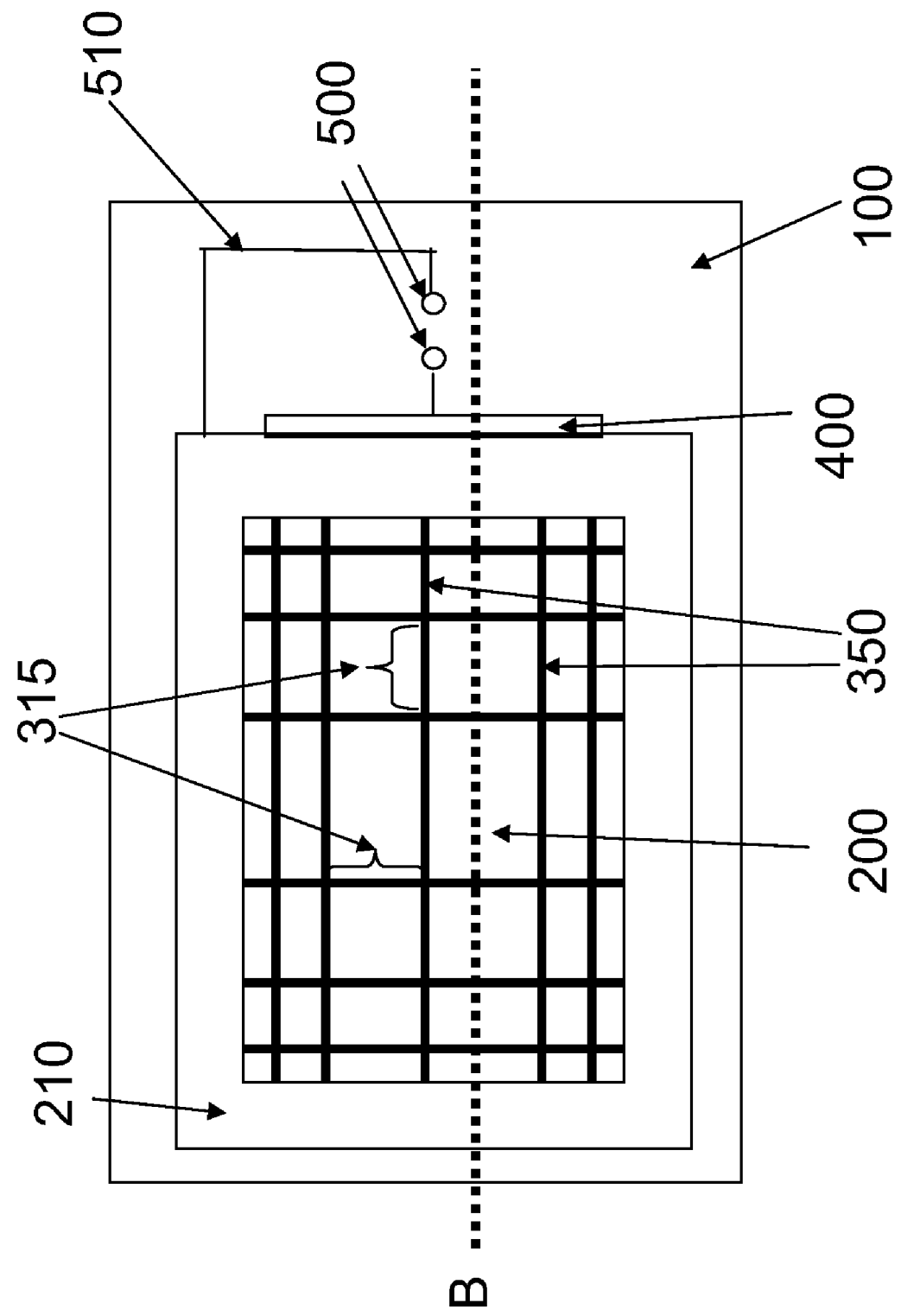
FIG. 12 shows in top view, the first electrode surface with a first contact and with insulating or nontransparent elements, which are formed in straight lines.

FIG. 12 shows, analogously to FIGS. 7 and 9, a variation of an exemplary embodiment. The top view is understood to be along the surface A from FIG. 1 and FIG. 8. Here, the first contact 210 is disposed on all sides of the first electrode surface 200, wherein it is connected, via an electrical conductor 510 and electrical connections 500, to the second electrode surface 400. The substrate 100 is located underneath it. Electrically insulating or nontransparent, linear elements 350 are located on the first electrode surface 200, and are disposed in the shape of a periodic structure, in a lattice. The lattice comprises a lattice spacing 315 between adjacent linear elements that increases with increasing distance from the first contact 210, and is greatest approximately in the center between the sides of the electrode surface, on which the contact is located. For clarity, the functional layer 300 is not drawn, the second electrode surface 400 is only suggested.

This means that, in regions near the contact, which without the linear elements would have a high intensity of emitted radiation, the insulating, linear elements 350 interrupt the electrical contact between the electrode surfaces and the functional layers in many partial regions 330, and thus, prevent radiation being emitted out of these regions; whereas in regions at a greater distance from the contact, which without the electrically insulating, linear elements would have a lower intensity of the emitted radiation, they interrupt the emitted radiation only to a small degree because the lattice spacing 315 there is larger. The width of the electrically insulating, linear elements 350 amounts to less than 200 μm, preferably less than 20 μm, and their thickness can lie in a range of less than 200 μm, preferably in a range from 100 nm to 10 μm. This means that the elements are no longer discernable to an outside observer.

If the linear elements 350 are nontransparent, electrically conducting conductive paths, they can also be present on the second electrode surface 400; however, the following description refers only to the first electrode surface 200. This means that the region with the lowest intensity of emitted radiation is covered by conductive paths 320 with a large lattice spacing 315 with respect to each other, whereas, near the contact, the lattice is denser. This leads to the fact that in the region near the contact, where without the electrically conductive paths 320 a high light density would prevail, a larger surface covering with conductive paths 320 is present. The width of the conductive paths amounts to less than 200 μm, preferably less than 20 μm, with the result that the conductive paths are no longer discernible by an outside observer. The thickness of the conductive paths can lie in the range of less than 200 μm, preferably in the range from 100 nm to 10 μm, which means that the conductive paths can be located only on the surface of the electrode surface, or extend into the functional layer 300 lying on the electrode surface. In a further embodiment, these can also pierce the second electrode surface 400. In this case, the individual conductive paths are surrounded by an insulating layer, for example, a polymer layer.

In addition, the layer thickness of the functional layer 300 present between the linear elements 350 also varies, such that the layer thickness decreases with increasing lattice spacing 315. This is illustrated in FIG. 13, which shows a schematic cross section along the axis B that is identified in FIG. 12. Here, the substrate 100 with the first electrode surface 200 and the first contact 210 can be seen. This contact can also enclose the first electrode surface 200 from all sides, which is not illustrated in the perspective shown in FIG. 13. The linear elements 350 are located on the first electrode surface 200, and are disposed in the shape of a lattice, where in FIG. 13 only elements of one alignment are represented. The linear elements 350 comprise a lattice spacing 315 that increases with increasing distance from the first contact 210, and has a maximum approximately in the center of the electrode surface. Located between the linear elements 350 is the functional layer 300, which comprises a layer thickness d that decreases with increasing lattice spacing 315. For clarity, the second electrode surface 400, the third contact 410 and the electrical connections 500 are not represented in FIG. 13.

With decreasing layer thickness d of the functional layer 300, i.e. with increasing lattice spacing 315 of the linear elements 350, the intensity of the emitted radiation can increase. Consequently, in regions that are located farther away from the first contact 210, the radiation is additionally increased. In this way, the light density differences which occur normally with conventional radiation emitting devices, and which would be present without the linear elements 350, are compensated or reduced. The linear elements 350 can comprise nontransparent conductive paths, conductive paths with an insulating layer, but also, electrically insulating materials, for example, a photoresist.

The invention is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

The invention claimed is:

1. A radiation emitting device, comprising
a substrate,
a layer sequence disposed on the substrate, the layer sequence comprising:
a first electrode surface on the substrate with a first contact for applying a voltage,
at least one functional layer, which emits radiation during operation,
a second electrode surface on the at least one functional layer,
a plurality of partial regions in the layer sequence, wherein the layer sequence is modified by the partial regions in such a way that the emission of radiation visible to an outside observer is interrupted, wherein a distribution density of each partial region varies depending on a distance of that partial region from the first contact, and a plurality of linearly shaped electrically insulating elements between the first electrode surface and the second electrode surface in the partial regions, wherein the linearly shaped electrically insulating elements have a distribution density and/or geometric configuration that varies depending on the distance of the elements from the first contact, wherein the linearly shaped electrically insulating elements are disposed in the at least one functional layer in form of a lattice.

2. The radiation emitting device according to claim 1, wherein the partial regions are not detectable by an outside observer with the naked eye.

3. The radiation emitting device according to claim 1, wherein light density of the emitted radiation is reduced in the partial regions.

4. The radiation emitting device according to claim 1, wherein the partial regions comprise microscopic dimensions.

5. The radiation emitting device according to claim 1, wherein the first contact is present on a side of the first electrode surface.

6. The radiation emitting device according to claim 1, wherein a third contact is present on a side of the second electrode surface.

7. The radiation emitting device according to claim 6, wherein the first and/or third contact is present on all sides of the first and/or second electrode surface.

8. The radiation emitting device according to claim 6, wherein the lattice comprises a lattice spacing between adjacent linearly shaped elements that increases with increasing distance from the first and/or the third contact.

9. The radiation emitting device according to claim 8, wherein the at least one functional layer is present at least between the linearly shaped elements, a layer thickness of the at least one functional layer decreasing with lattice spacing of the linearly shaped elements.

10. The radiation emitting device according to claim 9, wherein the intensity of the emitted radiation decreases with increasing layer thickness of the at least one functional layer.

11. The radiation emitting device according to claim 1, wherein the at least one functional layer comprises an organic functional layer.

12. The radiation emitting device according to claim 1, wherein the at least one functional layer comprises a charge transport layer.

13. The radiation emitting device according to claim 1, wherein the first and/or second electrode surface is semitransparent or transparent for the radiation emitted from the at least one functional layer.

14. The radiation emitting device according to claim 1, wherein the first and/or second electrode surface comprises a material selected from the group consisting of transparent metal oxides, organic conductive materials, and doped organic materials.

15. The radiation emitting device according to claim 1, wherein the linearly shaped electrically insulating elements have a distribution density that decreases with increasing distance from the first contact.

16. The radiation emitting device according to claim 1, wherein the linearly shaped electrically insulating elements are present in regions between the first and second electrode surface, and in these partial regions, prevent an emission of radiation from the device.

17. The radiation emitting device according to claim 1, wherein the distribution density of the linearly shaped electrically insulating elements is selected such that a difference of light density of the radiation emitted from the device between different regions of the device with different distribution densities of the elements has a maximum value of 20%.

18. The radiation emitting device according to claim 1, wherein the insulating elements are electrically insulating and interrupt the emission of radiation in the partial regions of the layer sequence in which they are present.

19. The radiation emitting device according to claim 1, wherein material of the electrically insulating elements is transparent for the emitted radiation.

20. The radiation emitting device according to claim 1, wherein the linearly shaped electrically insulating elements each have a microscopic size, wherein the size of each insulating element comprises less than 200 μm.

21. The radiation emitting device according to claim 1, wherein the insulating elements comprise a material selected from a group comprising photoresists, nitrides, ceramics, oxides and insulating organic compounds.

22. The radiation emitting device according to claim 1, wherein the lattice comprises a lattice spacing between adjacent linearly shaped elements that increases with increasing distance from the first contact and/or a third contact.

23. The radiation emitting device according to claim 22, wherein, at least between the linearly shaped elements, the at least one functional layer is disposed and has a layer thickness that decreases with increasing lattice spacing of the linearly shaped elements.

24. The radiation emitting device according to claim 23, wherein an intensity of the emitted radiation decreases with increasing layer thickness of the at least one functional layer.

25. The radiation emitting device according to claim 1, wherein the linearly shaped electrically insulating elements are nontransparent for the emitted radiation.

26. The radiation emitting device according to claim 25, wherein the linearly shaped electrically insulating elements reflect and/or absorb the emitted radiation in the partial regions of the layer sequence in which they are present.

27. The radiation emitting device according to claim 1, wherein the first electrode surface comprises a second contact for applying a voltage.

28. The radiation emitting device according to claim 27, wherein the second electrode surface comprises a third contact and a fourth contact.

29. The radiation emitting device according to claim 1, wherein in the partial regions, electrode material of the first and/or second electrode surface comprises structured regions.

30. The radiation emitting device according to claim 29, wherein the distribution density of the partial regions decreases with increasing distance from the first contact.

31. The radiation emitting device according to claim 1, wherein, in the partial regions, the at least one functional layer comprises a conductivity that is reduced due to the absence of doping and/or an increased operating voltage.

32. The radiation emitting device according to claim 31, wherein the distribution density of the partial regions decreases with increasing distance from the first contact.

33. A method for producing a radiation emitting device, the method comprising:

forming a layer sequence on a substrate, the layer sequence comprising a first electrode surface on the substrate with a first contact for applying a voltage, at least one functional layer that emits radiation during operation, and a second electrode surface on the at least one functional layer;

introducing a plurality of partial regions into the layer sequence, the layer sequence being modified by the partial regions such that the emission of radiation visible to an outside observer is interrupted, wherein the distribution density of each partial region varies depending on a distance from the first contact; and introducing a plurality of linearly shaped electrically insulating elements between the first electrode surface and the second electrode surface in the partial regions, wherein the linearly shaped electrically insulating elements have a distribution density and/or geometric configuration that varies depending on the distance of the elements from the first contact, wherein the linearly shaped electrically insulating elements are disposed in the at least one functional layer in form of a lattice.

34. The method according to claim 33, wherein, between the first and the second electrode surface, a plurality of insulating elements and/or elements that are nontransparent for the radiation is generated in the partial regions using a vapor deposition mask.

35. The method according to claim 33, wherein the first and/or second electrode surface is structured in the partial regions.

36. The method according to claim 33, wherein the at least one functional layer is not doped in the partial regions.

* * * * *

UNITED STATES PATENT AND TRADEMARK OFFICE
CERTIFICATE OF CORRECTION

PATENT NO. : 8,159,129 B2
APPLICATION NO. : 12/443324
DATED : April 17, 2012
INVENTOR(S) : Markus Klein et al.

Page 1 of 1

It is certified that error appears in the above-identified patent and that said Letters Patent is hereby corrected as shown below:

On the Title Page, item (73) Assignee, line 1, delete "OSRAM Opto Semiconductor GmbH," and insert --OSRAM Opto Semiconductors GmbH,--.

Signed and Sealed this
Twenty-sixth Day of July, 2016

Michelle K. Lee
*Director of the United States Patent and Trademark Office*